US006987377B2

(12) United States Patent
Sakakibara et al.

(10) Patent No.: US 6,987,377 B2
(45) Date of Patent: Jan. 17, 2006

(54) STATE-OF-CHARGE DETECTOR, PROGRAM, METHOD AND CHARGE-DISCHARGE CONTROL DEVICE UTILIZING RATE OF CHANGE OF INTERNAL RESISTANCE

(75) Inventors: Teruhiko Sakakibara, Nishio (JP); Shoji Sakai, Toyota (JP); Yoshiyuki Nakayama, Toyota (JP)

(73) Assignees: Nippon Soken, Inc., Nishio (JP); Toyota Jidosha Kabushiki Kaisha, Toyota (JP)

( * ) Notice: Subject to any disclaimer, the term of this patent is extended or adjusted under 35 U.S.C. 154(b) by 208 days.

(21) Appl. No.: 10/614,216

(22) Filed: Jul. 8, 2003

(65) Prior Publication Data

US 2004/0012373 A1     Jan. 22, 2004

(30) Foreign Application Priority Data

Jul. 22, 2002    (JP)  ............................. 2002-212828

(51) Int. Cl.
*H01M 10/44*     (2006.01)
*H01M 10/46*     (2006.01)

(52) U.S. Cl. .................................................... 320/132
(58) Field of Classification Search ................ 320/132, 320/149, 150; 324/427, 430, 431
See application file for complete search history.

(56) References Cited

U.S. PATENT DOCUMENTS 6,424,157 B1 *   7/2002   Gollomp et al. ............ 320/132

FOREIGN PATENT DOCUMENTS

| JP | 63-140630 A | 6/1988 |
| JP | 11-289693 A | 10/1999 |
| JP | A-11-289683 A | 10/1999 |

* cited by examiner

Primary Examiner—Edward H. Tso
(74) Attorney, Agent, or Firm—Kenyon & Kenyon

(57) ABSTRACT

A state-of-charge detector device for detecting the state of charge of a secondary battery is provided. The device has a current detector that detects an electric current through the secondary battery, a voltage detector that detects a voltage between terminals of the secondary battery, and an internal resistance calculator that calculates an internal resistance of the secondary battery based on the detected current and the detected voltage. Furthermore, an internal resistance changing rate calculator is provided which calculates a rate of change in the internal resistance calculated, with respect to an amount of charge stored in the secondary battery. A state-of-charge determinator determines a state of charge of the secondary battery based on the rate of change in the internal resistance calculated.

16 Claims, 6 Drawing Sheets

STATE-OF-CHARGE DETECTOR, PROGRAM, METHOD AND CHARGE-DISCHARGE CONTROL DEVICE UTILIZING RATE OF CHANGE OF INTERNAL RESISTANCE

INCORPORATION BY REFERENCE

The disclosure of Japanese Patent Applications No. 2002-212828 filed on Jul. 22, 2002, including the specification, drawings and abstract is incorporated herein by reference in its entirety.

BACKGROUND OF THE INVENTION

1. Field of the Invention

The invention relates to a state-of-charge detector device, a program thereof, and a full charge determining method. More particularly, the invention relates to a state-of-charge detector device for detecting the state of charge of a secondary battery, and a program that causes a computer to function as a secondary battery charge-discharge determining device, as well as a state-of-charge detecting method for detecting the state of charge of a secondary battery, and a charge-discharge control device for controlling the charging and discharging of a secondary battery.

2. Description of the Related Art

Conventionally proposed devices of the aforementioned type for detecting the state of charge of a secondary battery include a device that detects a fully charged state of a secondary battery on the basis of an inter-terminal voltage, and a device that detects a fully charged state of a secondary battery on the basis of a fall of the inter-terminal voltage. The former device detects the fully charged state of a secondary battery when the inter-terminal voltage of the battery reaches a predetermined threshold value. The latter device detects the fully charged state when the inter-terminal voltage of the secondary battery decreases by at least a predetermined amount after increasing to a peak. Therefore, it is considered possible to prevent the overcharge of a secondary battery by controlling the charging of the secondary battery so that the secondary battery will not be charged beyond the fully charged state detected as described above.

However, in some cases, the former device, which detects the fully charged state on the basis of the inter-terminal voltage, has a drawback as follows. That is, the degree of rise of the inter-terminal voltage of a secondary battery when the battery is reaching the fully charged state becomes small depending on the kind of secondary battery, such as an alkaline type battery (Ni-MH battery or the like) or the like. In such a case, the discrimination of the inter-terminal voltage with reference to the predetermined threshold value is likely to have an error, and therefore the device cannot precisely determine whether the battery has reached the fully charged state. The latter device, which detects the fully charged state when the inter-terminal voltage of a secondary battery has decreased by a predetermined amount after reaching a peak, has a drawback as follows. That is, in some cases, a distinguished peak of the inter-terminal voltage does not appear. In such cases, the device will face difficulty in detecting the fully charged state. There exist other devices which detect the fully charged state of a secondary battery on the basis of the deviation between the temperature of the secondary battery and an ambient temperature utilizing the fact that the temperature of a secondary battery rises as the battery approaches the fully charged state, or which detect the fully charged state of a secondary battery on the basis of the time-based rising rate of the temperature of the secondary battery. However, the temperature of a secondary battery is considerably affected by various factors, such as the configuration of the battery, the heat capacity thereof, the charging speed, the heat generation based on internal resistance, etc. Therefore, it is very difficult for these devices to detect the fully charged state of a secondary battery with high precision under precise condition setting.

SUMMARY OF THE INVENTION

Accordingly, it is an object of the invention to provide a state-of-charge detector device, a program thereof, a state-of-charge detecting method, and a charge-discharge control device that improve the precision in detection of the state of charge of a secondary battery.

The state-of-charge detector device for detecting a state of charge of the invention is a state-of-charge detector device that detects a state of charge of a secondary battery which includes: a current detector that detects an electric current through the secondary battery; a voltage detector that detects a voltage between terminals of the secondary battery; and an internal resistance calculator that calculates an internal resistance of the secondary battery based on the current detected and the voltage detected. The device also includes an internal resistance changing rate calculator that calculates a rate of change in the internal resistance calculated, with respect to an amount of charge stored in the secondary battery. Furthermore, state-of-charge determinator is provided which determines a state of charge of the secondary battery based on the rate of change in the internal resistance calculated.

The above-described state-of-charge detector device calculates the internal resistance of the secondary battery based on the current through the secondary battery detected by the current detector and the voltage between the terminals of the secondary battery detected by the voltage detector, and calculates the rate of change in the internal resistance with respect to the amount of charge stored in the secondary battery, and determines the state of charge of the secondary battery based on the calculated rate of change in the internal resistance. The internal resistance of a secondary battery rises as the secondary battery is charged. Immediately before the fully charged state is reached, the internal resistance of the secondary battery inflects and then decreases. That is, the rate of change in the internal resistance with respect to the amount of charge stored in the secondary battery shifts from the positive side to the negative side at a predetermined reference point immediately prior to the fully charged state. Therefore, the state of charge can be determined on the basis of the rate of change in the internal resistance. In particular, the precision in detection of the state of charge immediately prior to the full charge can be improved.

According to another aspect of the invention, a program as described below is provided.

That is, a program that causes a computer connected to a current detector that detects an electric current through a secondary battery and to a voltage detector that detects a voltage between terminals of the secondary battery, to function as a state-of-charge detector device that detects a state of charge of the secondary battery, includes: (a) the step of calculating an internal resistance of the secondary battery based on the current detected by the current detector and the voltage detected by the voltage detector; (b) the step of calculating a rate of change in the internal resistance calculated, with respect to an amount of charge stored in the secondary battery; and (c) the step of determining a state of charge of the secondary battery based on the rate of change in the internal resistance calculated.

The above-described program causes a computer connected to the current detector and the voltage detector to function as a state-of-charge detector device according to the invention. Therefore, the program achieves advantages similar to those of the state-of-charge detector device of the invention. For example, the program is able to determine the state of charge of a secondary battery based on the rate of change in the internal resistance and, more particularly, is able to improve the precision in detection of the state of charge immediately preceding the fully charged state.

According to still another aspect of the invention, a state-of-charge detecting method as described below is provided.

That is, a state-of-charge detecting method for detecting a state of charge of a secondary battery includes: (a) the step of detecting an electric current through the secondary battery; (b) the step of detecting a voltage between terminals of the secondary battery; (c) the step of calculating an internal resistance of the secondary battery based on the current detected and the voltage detected; (d) the step of calculating a rate of change in the internal resistance calculated, with respect to an amount of charge stored in the secondary battery; and (e) the step of determining a state of charge of the secondary battery based on the rate of change in the internal resistance calculated.

In the above-described state-of-charge detecting method of the invention, the internal resistance of the secondary battery is calculated on the basis of the electric current through the secondary battery detected by the current detector, and the voltage between the terminals of the secondary battery detected by the voltage detector. Furthermore, the rate of change in the internal resistance with respect to the amount of charge stored in the secondary battery is calculated. On the basis of the calculated rate of change in the internal resistance, the state of charge of the secondary battery is determined. The internal resistance of a secondary battery rises as the secondary battery is charged. Immediately prior to the fully charged state of the secondary battery, the internal resistance inflects and then decreases. That is, the rate of change in the internal resistance with respect to the amount of charge stored in the secondary battery shifts from the positive side to the negative side at a predetermined point immediately prior to the fully charged state. Therefore, the state of charge can be determined on the basis of the rate of change in the internal resistance. In particular, the precision in detection of the state of charge immediately prior to the full charge can be improved.

According to a further aspect of the invention, a charge-discharge control device as described below is provided.

That is, a charge-discharge control device that controls charging and discharging of a secondary battery includes: a state-of-charge detector device as described above which detects a state of charge of the secondary battery; and a charge-discharge controller that controls the charging and discharging of the secondary battery based on the state of charge detected.

This charge-discharge control device controls the charging and discharging of the secondary battery on the basis of the state of charge detected by the above-described state-of-charge control device. If the electric current input to the secondary battery is curbed so as to restrict the charging of the secondary battery as the secondary battery approaches the fully charged state, for example, when the rate of change in the internal resistance with respect to the amount of charge undergoes a positive-to-negative shift, it becomes possible to more reliably accomplish the charging of the secondary battery without allowing the over-charging thereof.

BRIEF DESCRIPTION OF THE DRAWINGS

The above mentioned and other objects, features, advantages, technical and industrial significance of this invention will be better understood by reading the following detailed description of preferred embodiments of the invention, when considered in connection with the accompanying drawings, in which.

DESCRIPTION OF THE EXEMPLARY EMBODIMENTS

In the following description and the accompanying drawings, the present invention will be described in more detail with reference to exemplary embodiments.

Figure 1:
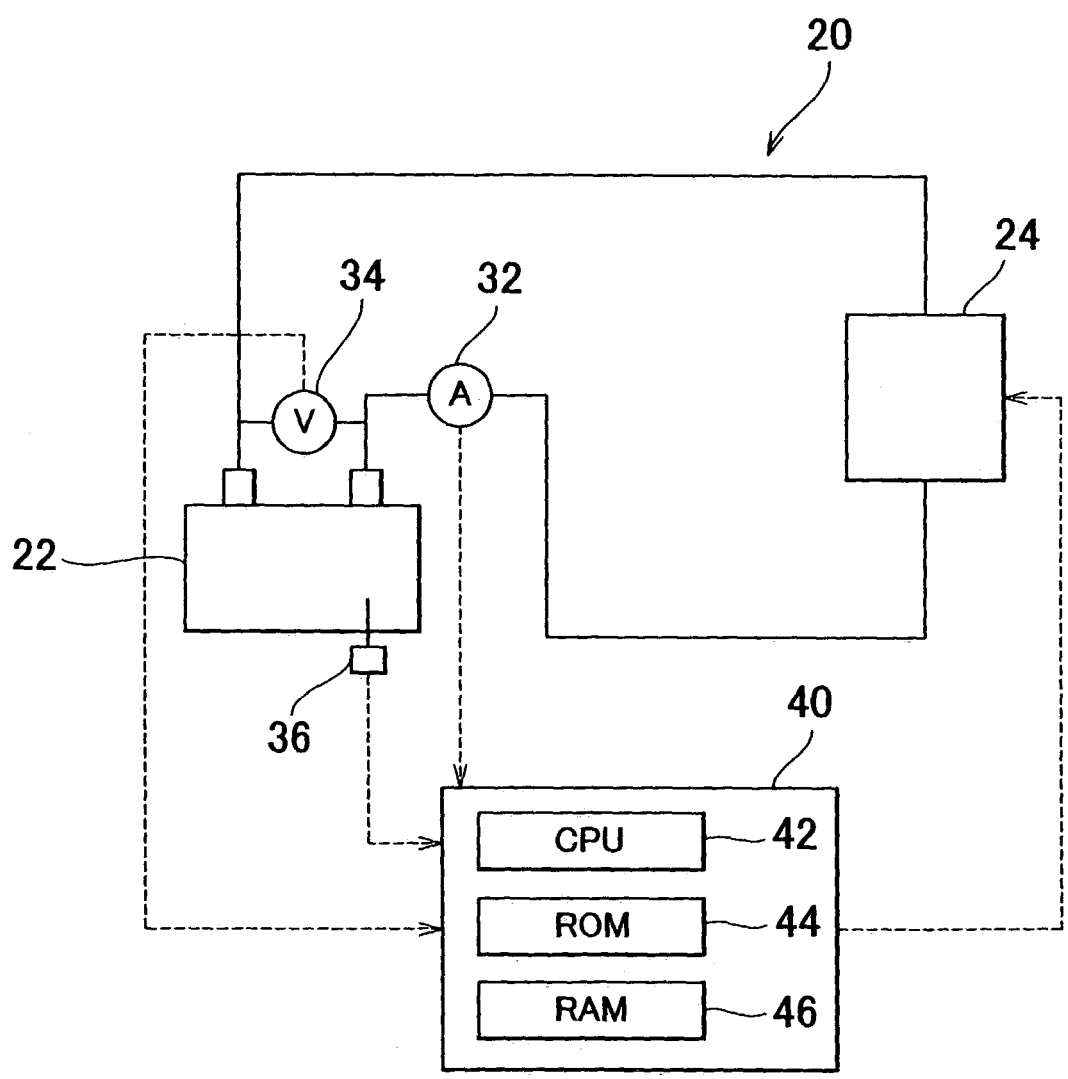
FIG. 1 is a schematic diagram illustrating a construction of a charge-discharge control device 20 that also functions as a state-of-charge detector device for a secondary battery in accordance with an exemplary embodiment of the invention.

An exemplary embodiment of the invention will be described below. FIG. 1 is a schematic diagram illustrating a construction of a charge-discharge control device 20 that also functions as a state-of-charge detector device. As shown in FIG. 1, the charge-discharge control device 20 is designed so as to control the charging and discharging of a secondary battery 22 (e.g., a nickel metal hydride battery) that is connected to a load 24. The control device 20 has a current sensor 32 for detecting the electric current through the secondary battery 22, a voltage sensor 34 for detecting the voltage between terminals of the secondary battery 22, a temperature sensor 34 for detecting the temperature of the secondary battery 22, and an electronic control unit 40 for controlling the entire device. For example, if the charge-discharge control device 20 is installed in a hybrid type electric vehicle, it is possible to conceive, as the load 24, a motor capable of outputting drive force to a drive shaft connected to wheels and generating electric power upon receiving drive force from an engine, and an inverter for driving and controlling the motor. In such a case, the charging and discharging of the secondary battery 22 can be controlled through the switching control of switching elements (e.g., power MOSs, IGBTs, etc.) provided in the inverter.

The electronic control unit 40 is formed as a 1-chip microcomputer having a CPU 42 as a central portion. In addition to the CPU 42, the unit 40 has a ROM 44 in which a processing program is stored, a RAM 46 for temporarily storing data, and input-output ports (not shown). The electronic control unit 40 receives via input ports a charge-discharge current I of the secondary battery 22 from the current sensor 32, an inter-terminal voltage V of the secondary battery from the voltage sensor 34, a battery temperature BT of the secondary battery 22 from the temperature sensor 36, various signals from the load 24, etc. The electronic control unit 40 outputs drive signals to the load 24, and the like, via output ports.

Figure 2A:
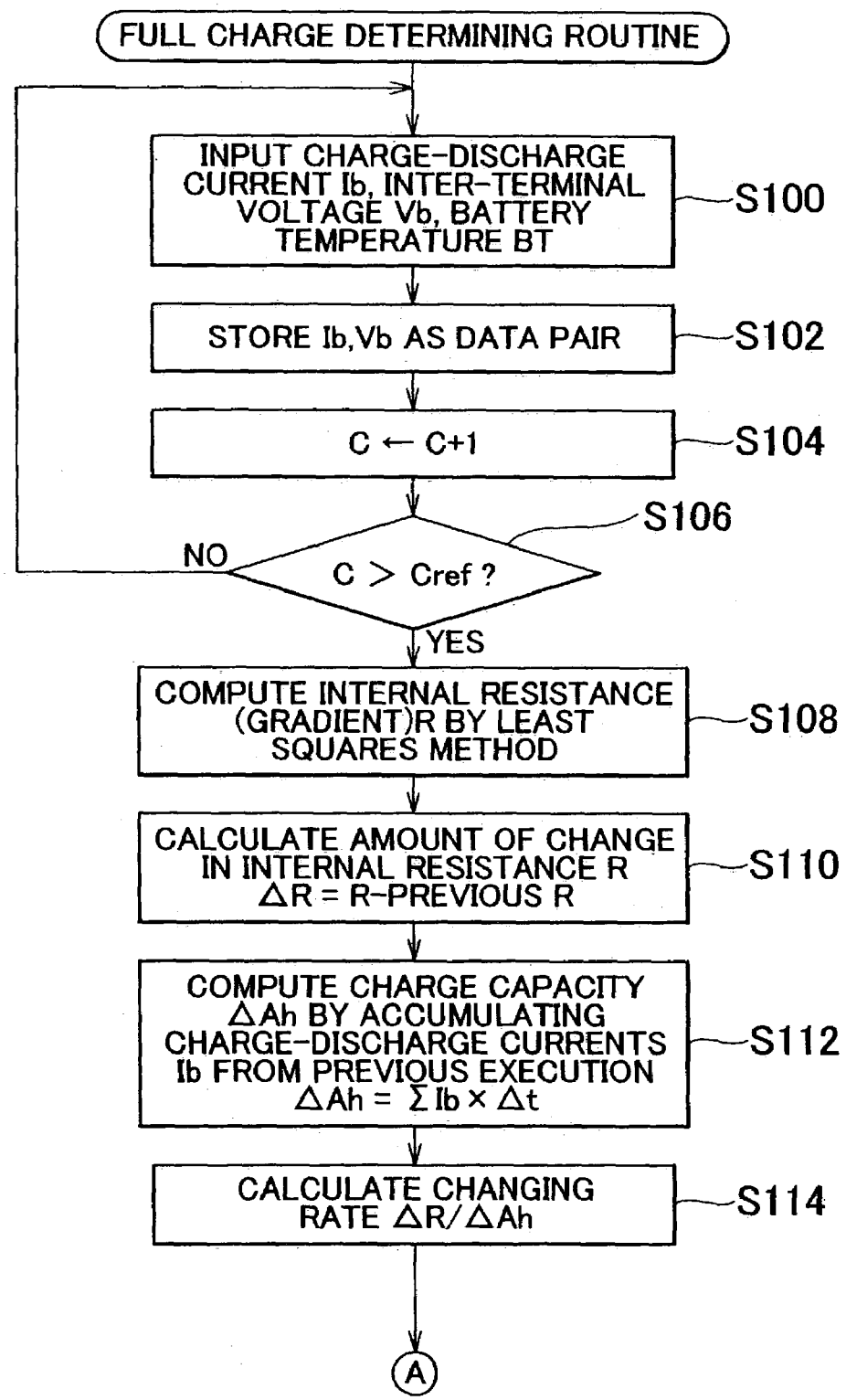
FIGS. 2a and 2b are flowcharts illustrating a full charge determining routine executed by the state-of-charge detector device of the embodiment.
Figure 2B:
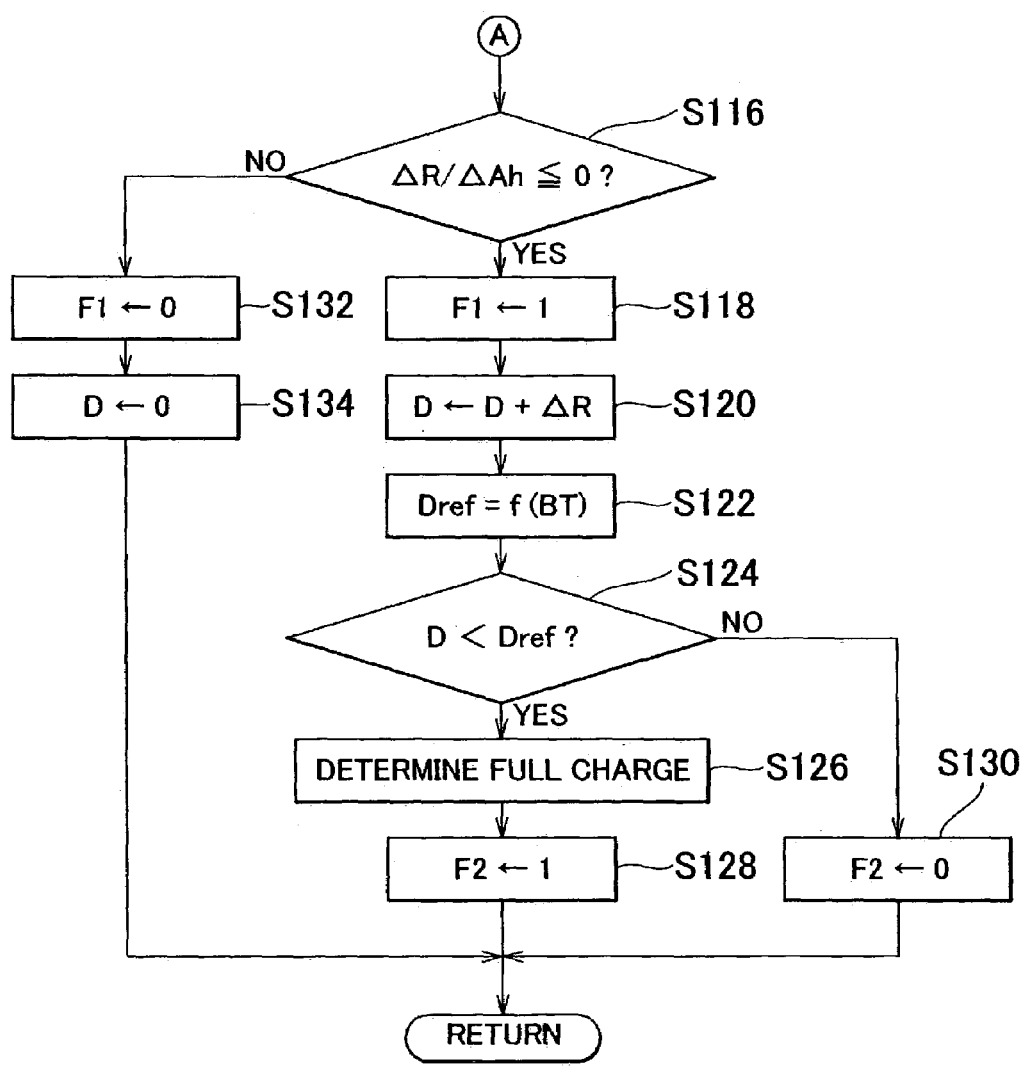

Operation of the thus-constructed charge-discharge control device 20 of the embodiment will next be described. Firstly, an operation that the charge-discharge control device 20 performs when functioning as a state-of-charge detector device will be described. FIGS. 2a and 2b are flowcharts illustrating a full charge determining routine executed by the electronic control unit 40. This routine is executed at every elapse of a predetermined time.

When execution of the full charge determining routine starts, the CPU 42 of the electronic control unit 40 first executes a process of inputting a charge-discharge current Ib detected by the current sensor 32, an inter-terminal voltage Vb detected by the voltage sensor 34 at the same timing as the detection timing of the current sensor 32, and a battery temperature BT detected by the temperature sensor 36 (step S100). As for the charge-discharge current Ib, the inter-terminal voltage Vb and the battery temperature BT, values thereof obtained by sampling at predetermined time intervals Δt are stored in predetermined areas of the RAM 46. Therefore, the process of inputting the charge-discharge current Tb, the inter-terminal voltage Vb and the battery temperature BT is a process of reading the latest ones of the values stored in the RAM 46. Subsequently, the charge-discharge current Ib and the inter-terminal voltage Vb thus read are stored as a pair of data into a predetermined area of the RAM 46 (step S102), and a counter value C is incremented (step S104). It is then determined whether the counter value C has exceeded a predetermined threshold value Cref (step S106). Until it is determined that the counter value C has become greater than the threshold value Cref, the process of step S100 to S104 is repeatedly performed. The counter value C indicates the number of data pairs stored in the predetermined area of the RAM 46, and is initially set at a value "0". The threshold value Cref is a threshold set in order to secure a necessary number of data pairs for computing an internal resistance R (described below) with a sufficient accuracy such that the change in the charge capacity occurring during a period of the counting performed by the counter can be ignored.

Figure 3A:
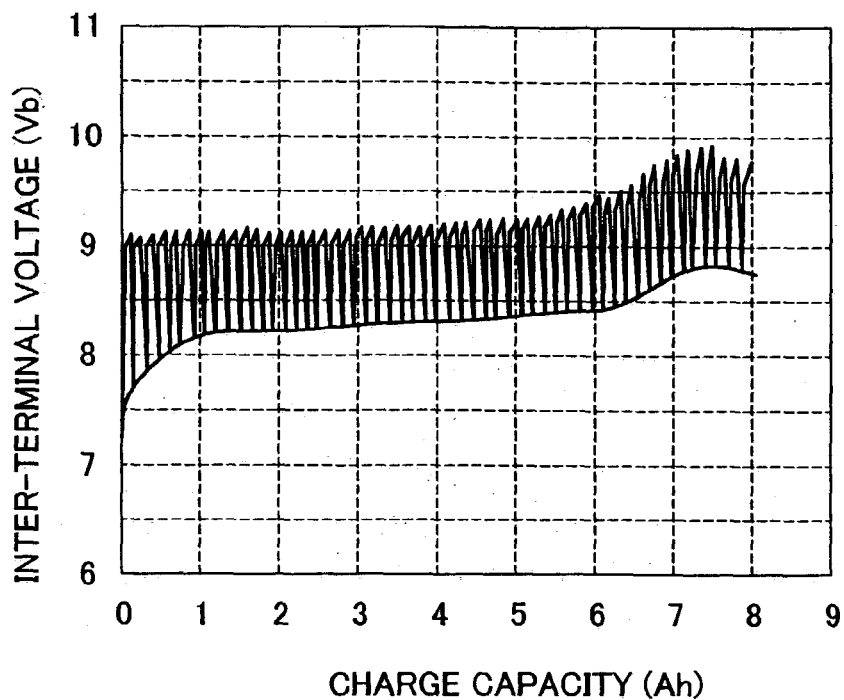
FIG. 3a is a diagram indicating a relationship between the inter-terminal voltage Vb and the charge capacity Ah of a secondary battery.
Figure 3B:
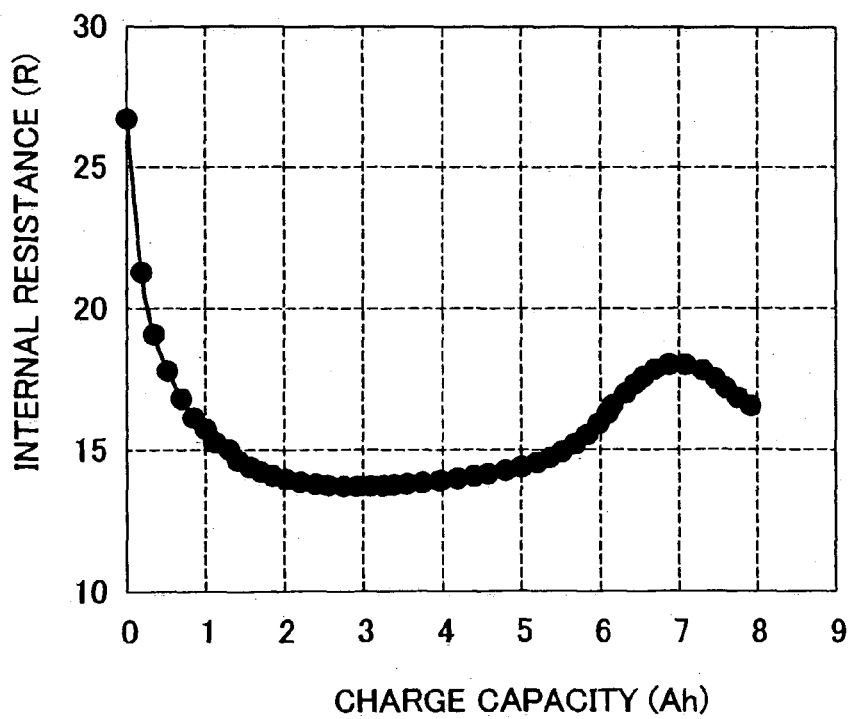
FIG. 3b is a diagram indicating a relationship between the internal resistance R and the charge capacity Ah of the secondary battery.

When it is determined that the counter value C is greater than the threshold value Cref, a gradient, that is, an internal resistance R, is computed from the plurality of data pairs using a least squares method (step S108). Then, an amount of change ΔR of the internal resistance R (=R−the previous R) is calculated (step S110). The amount of change ΔR is computed by subtracting the previous value of internal resistance R computed during the previous execution of the routine from the presently computed internal resistance R. After that, a charge capacity ΔAh (=ΣIb×Δt where Δt represents the aforementioned interval of sampling the charge-discharge current Ib) is computed by accumulating the charge-discharge currents I stored in the predetermined area of the RAM 46 during the previous execution of the routine (step S112). Subsequently, the amount of change ΔR is divided by the charge capacity ΔAh to determine a changing rate ΔR/ΔAh of the internal resistance with respect to the charge capacity ΔAh (step S114). It is then determined whether the calculated changing rate ΔR/ΔAh of the internal resistance is at most "0" (step S116). FIG. 3a is a diagram indicating a relationship between the inter-terminal voltage Vb and the charge capacity Ah of a secondary battery. FIG. 3b is a diagram indicating a relationship between the internal resistance R and the charge capacity Ah of the secondary battery. Through comparison of FIGS. 3a and 3b, it can be understood that the inter-terminal voltage Vb and the internal resistance R considerably increase during an approach to the fully charged state, and then decrease after a peak. However, the characteristic of the internal resistance R with respect to the charge capacity Ah is different from that of the inter-terminal voltage Vb with respect to the charge capacity Ah. Specifically, the internal resistance R reaches a peak at an earlier timing than the inter-terminal voltage Vb; that is, the peak of the internal resistance R appears a relatively plenty of time before the fully charged state is actually reached. Therefore, if the time at which the peak of the internal resistance R with respect to the charge capacity Ah appears, that is, the time at which the changing rate ΔR/ΔAh of the internal resistance with respect to a unit charge capacity becomes substantially equal to "0", is used as a reference to determine whether the fully charged state is reached, it becomes possible to more reliably prevent over-discharge of the secondary battery 22 at the time of determination that the secondary battery 22 is fully charged. The peak of the internal resistance R with respect to the charge capacity Ah appearing immediately prior to the fully charged state is based on a fact that as the secondary battery 22 approaches the fully charged state, the internal resistance temporarily rises due to production of a gas (oxygen) on a positive electrode, and then decreases due to a subsequent rise in temperature.

Figure 4:
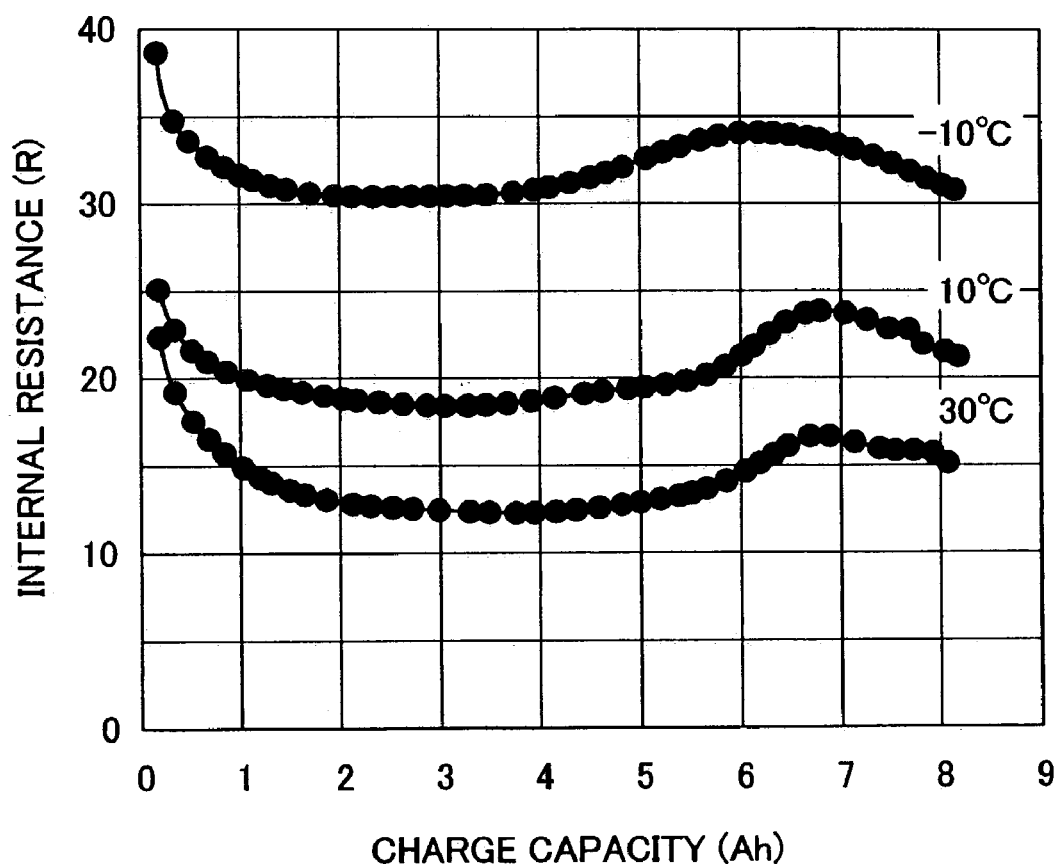
FIG. 4 is a diagram indicating a relationship among the battery temperature BT, the internal resistance R and the charge capacity Ah of the secondary battery.

If it is determined that the changing rate ΔR/ΔAh of the internal resistance with respect to the charge capacity ΔAh is equal to or less than "0", a flag F1 that indicates whether the secondary battery is in a state near the fully charged state is set at a value "1" indicating the state near the fully charged state (step S118). An amount of decrease D (negative value) in the internal resistance that occurs after the changing rate ΔR/ΔAh of the internal resistance decreases to or below "0" is calculated on the basis of the amount of change ΔR computed in step S110 as in a mathematical expression 1 (step S120). A threshold value Dref (negative value) for determination regarding the fully charged state is set on the basis of the temperature of the secondary battery 22 detected by the temperature sensor 36 (step S122). The threshold value Dref is a value that indicates the amount of decrease in the internal resistance that occurs during a period from the peak of the internal resistance until the fully charged state, and is set considering the battery temperature BT, the characteristic of the secondary battery, etc. The threshold value Dref is set on the basis of the battery temperature BT because the timing of the peak of the internal resistance R varies depending on the battery temperature BT (the peak of the internal resistance R appears earlier if the battery temperature BT is lower) and the charge capacity at the time of full charge correspondingly changes, as can be understood from the relationship among the battery temperature BT, the internal resistance R, and the battery temperature BT indicated in FIG. 4.

$$D \leftarrow D + \Delta R \qquad \text{[Expression 1]}$$

After the threshold value Dref is set, it is determined whether the amount of decrease D in the internal resistance is less than the threshold value Dref, that is, whether the internal resistance has decreased by more than the absolute value of the threshold value Dref following the time of the changing rate $\Delta R/\Delta Ah$ of the internal resistance reaching "0" (step S124). If it is determined that the amount of decrease D is less than the threshold value Dref, it is determined that the full charge has been reached (step S126). After a flag F2 that indicates whether the secondary battery 22 has reached the fully charged state is set at a value "1" indicating the fully charged state (step S128), the routine ends. Conversely, if it is determined that the amount of decrease D is not less than the threshold value Dref, the value of the flag F2 is set at a value "0" indicating that the fully charged state has not been reached (step S130). Subsequently, the routine ends.

If it is determined in step S116 that the changing rate $\Delta R/\Delta Ah$ of the internal resistance with respect to the charge capacity $\Delta Ah$ is greater than the value "0" (including a case where the changing rate $\Delta R/\Delta Ah$ once becomes negative and then changes from a negative value to a positive value due to discharge), the flag F1 is set at "0" indicating that there still is an allowance before the fully charged state (step S132), and the amount of decrease D in the internal resistance after the changing rate $\Delta R/\Delta Ah$ of the internal resistance has become equal to or less than the value "0" is set at the value "0" (step S134). Subsequently, the routine ends.

Figure 5:
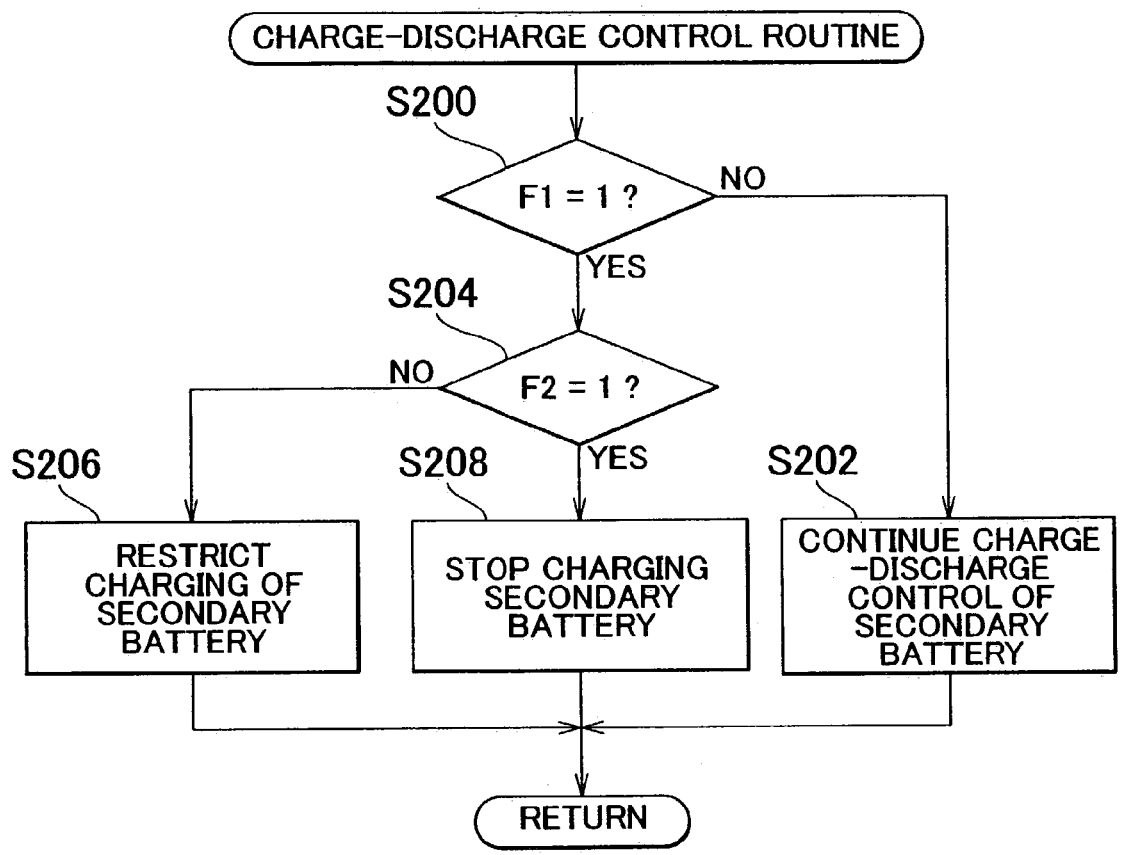
FIG. 5 is an exemplary flowchart illustrating a charge-discharge control routine executed by the charge-discharge control device 20 of the embodiment.

Next described will be a control of the charging and discharging of the secondary battery 22 performed by the charge-discharge control device 20. FIG. 5 is a flowchart illustrating a charge-discharge control routine executed by the electronic control unit 40. This routine is executed at every elapse of a predetermined time.

When the charge-discharge control routine starts, the CPU 42 of the electronic control unit 40 first checks the value of the flag F1 set in step S118 or step S132 in the full charge determining routine illustrated in FIG. 2a and 2b (step S200). If it is determined in step S200 that the value of the flag F1 is "0", that is, if it is determined that the secondary battery 22 still has an allowance prior to the fully charged state, it is considered that there is no need to restrict the charging of the secondary battery 22, and the charge-discharge control is continued (step S202). Subsequently, the routine ends. Conversely, if it is determined that the value of the flag F1 is "1", that is, if it is determined that the secondary battery 22 is nearly in the fully charged state, the CPU 42 checks the value of the flag F2 set in step S128 or step S130 in the full charge determining routine illustrated in FIG. 2a and 2b (step S204). If it is determined in step S204 that the value of the flag F2 is "0", that is, if it is determined that the secondary battery 22 is nearly fully charged state but has not reached the fully charged state, the CPU 42 restricts the electric current input to the secondary battery 22 (step S206). If it is determined that the value of the flag F2 is "1", that is, if it is determined that the secondary battery 22 has reached the fully charged state, the CPU 42 stops the charging of the secondary battery 22 (step S208). After that, the CPU 42 ends the routine. Thus, if the flag F1 is set at the value "1" and therefore the secondary battery 22 is nearly in the fully charged state, the electric current input to the secondary battery 22 is restricted until the flag F2 is set at the value "1", that is, until the secondary battery 22 reaches the fully charged state. In this manner, the secondary battery 22 can be more reliably prevented from becoming over-charged.

According to the above-described charge-discharge control device 20 of the embodiment, the state-of-charge detector device determines that the secondary battery 22 has reached the fully charged state if the internal resistance R has decreased by more than the absolute value of the threshold value Dref following a shift of the changing rate $\Delta R/\Delta Ah$ from a positive value to a negative value, utilizing the fact that the changing rate $\Delta R/\Delta Ah$ of the internal resistance undergoes a positive-to-negative shift immediately prior to the fully charged state of the secondary battery 22. Therefore, the full charge of the secondary battery 22 can be detected with good precision. Furthermore, the charging of the secondary battery 22 is restricted if the changing rate $\Delta R/\Delta Ah$ of the internal resistance undergoes a positive-to-negative shift. Therefore, it is possible to more reliably charge the secondary battery 22 to the fully charged state without allowing the over-charge of the secondary battery 22.

In the foregoing description, the state-of-charge detector device of the embodiment computes the changing rate $\Delta R/\Delta Ah$, that is, the amount of change $\Delta R$ of the internal resistance with respect to the charge capacity $\Delta Ah$ that is an accumulated value of the charge-discharge current Ib through the secondary battery 22, and uses the time point of the shift of the changing rate $\Delta R/\Delta Ah$ from the positive side to the negative side as a reference point that indicates the vicinity of the fully charged state, and determines whether the secondary battery 22 is in the fully charged state on the basis of the amount of decrease in the internal resistance following the reference point. However, the device may also be designed so as to compute a changing rate $\Delta R/\Delta W$ that is the amount of change $\Delta R$ of the internal resistance with respect to the electric power capacity $\Delta W$ that is an accumulated value of the power (Ib×Vb) charged into the secondary battery 22, and use the time point of a positive-to-negative shift of the changing rate $\Delta R/\Delta W$ as a reference point that indicates the vicinity of the fully charged state, and determine whether the secondary battery 22 is in the fully charged state on the basis of the amount of decrease in the internal resistance following the reference point. Furthermore, in the case of fixed-current charge of the secondary battery 22, it is possible to use the time point at which a time-dependent changing rate dR/dt of the internal resistance undergoes a positive-to-negative shift as a reference point that indicates the vicinity of the fully charged state, and determine whether the secondary battery 22 is in the fully charged state on the basis of the amount of decrease in the internal resistance following the reference point.

Although in the state-of-charge detector device of the embodiment, the threshold value Dref used for determining whether the secondary battery 22 is in the fully charged state on the basis of the amount of decrease D in the internal resistance from the peak is set in accordance with the battery temperature BT of the secondary battery 22, the threshold value Dref may be set at a fixed value regardless of the battery temperature BT.

Furthermore, the state-of-charge detector device of the embodiment determines that the secondary battery 22 is in the fully charged state if the internal resistance has decreased by at least the absolute value of the threshold value Dref following the positive-to-negative shift of the changing rate $\Delta R/\Delta Ah$ of the internal resistance. However, in another possible construction, the device may also compute the amount of decrease in the inter-terminal voltage Vb of the secondary battery 22 from the peak, a deviation between the ambient temperature and the temperature of the secondary battery, a time-dependent rising rate of the temperature of the secondary battery, etc., and may determine that the secondary battery is in the fully charged state when any one of the computed values reaches a point where it can be considered that the fully charged state has been reached.

Although the state-of-charge detector device of the embodiment detects the fully charged state of the secondary battery 22, the device may be designed so as to detect a state of charge immediately preceding the fully charged state, for example, a state of charge of 80%, 90%, etc., since the changing rate $\Delta R/\Delta Ah$ of the internal resistance exhibits a unique characteristic immediately prior to the fully charged state.

Although the foregoing embodiment is described in conjunction with a charge-discharge detector device that detects the full charge of the secondary battery 22 as a specific state of charge, the device is a mere illustration. That is, it is possible to adopt various forms, for example, a state-of-charge detecting method for detecting the full charge of a similar secondary battery as a specific state of charge, a program that causes a single computer or a plurality of computers to function as a state-of-charge detector device, etc.

While the invention has been described with reference to preferred embodiments thereof, it is to be understood that the invention is not limited to the preferred embodiments or constructions. To the contrary, the invention is intended to cover various modifications and equivalent arrangements. In addition, while the various elements of the preferred embodiments are shown in various combinations and configurations, which are exemplary, other combinations and configurations, including more, less or only a single element, are also within the spirit and scope of the invention.

What is claimed is:

1. A state-of-charge detector device that detects a state of charge of a secondary battery, comprising:
   a current detector that detects an electric current through the secondary battery;
   a voltage detector that detects a voltage between terminals of the secondary battery;
   an internal resistance calculator that calculates an internal resistance of the secondary battery based on the current detected and the voltage detected;
   an internal resistance changing rate calculator that calculates a rate of change in the internal resistance calculated, with respect to an amount of charge stored in the secondary battery; and
   a state-of-charge determinator that determines a state of charge of the secondary battery based on a peak in the internal resistance calculated.

2. The state-of-charge detector device according to claim 1, wherein the state-of-charge determinator determines that the secondary battery is fully charged, if the internal resistance has decreased by at least a predetermined value following a positive-to-negative shift of the rate of change in the internal resistance.

3. The state-of-charge detector device according to claim 2, wherein the internal resistance changing rate calculator calculates the rate of change in the internal resistance with respect to the amount of charge that is an accumulated amount of the current detected by the current detector.

4. The state-of-charge detector device according to claim 3, further comprising a temperature detector that detects a temperature of the secondary battery,
   wherein the state-of-charge determinator determines the state of charge based on the temperature of the secondary battery detected by the temperature detector and the rate of change in the internal resistance calculated by the internal resistance changing rate calculator.

5. The state-of-charge detector device according to claim 2, wherein the internal resistance changing rate calculator calculates the rate of change in the internal resistance with respect to the amount of charge that is an accumulated amount of electric power calculated from the current detected by the current detector and the voltage detected by the voltage detector.

6. The state-of-charge detector device according to claim 5, further comprising a temperature detector that detects a temperature of the secondary battery,
   wherein the state-of-charge determinator determines the state of charge based on the temperature of the secondary battery detected by the temperature detector and the rate of change in the internal resistance calculated by the internal resistance changing rate calculator.

7. The state-of-charge detector device according to claim 2, further comprising a temperature detector that detects a temperature of the secondary battery,
   wherein the state-of-charge determinator determines the state of charge based on the temperature of the secondary battery detected by the temperature detector and the rate of change in the internal resistance calculated by the internal resistance changing rate calculator.

8. The state-of-charge detector device according to claim 1, wherein the internal resistance changing rate calculator calculates the rate of change in the internal resistance with respect to the amount of charge that is an accumulated amount of the current detected by the current detector.

9. The state-of-charge detector device according to claim 8, further comprising a temperature detector that detects a temperature of the secondary battery,
   wherein the state-of-charge determinator determines the state of charge based on the temperature of the secondary battery detected by the temperature detector and the rate of change in the internal resistance calculated by the internal resistance changing rate calculator.

10. The state-of-charge detector device according to claim 1, wherein the internal resistance changing rate calculator calculates the rate of change in the internal resistance with respect to the amount of charge that is an accumulated amount of electric power calculated from the current detected by the current detector and the voltage detected by the voltage detector.

11. The state-of-charge detector device according to claim 10, further comprising a temperature detector that detects a temperature of the secondary battery,
    wherein the state-of-charge determinator determines the state of charge based on the temperature of the secondary battery detected by the temperature detector and the rate of change in the internal resistance calculated by the internal resistance changing rate calculator.

12. The state-of-charge detector device according to claim 1, further comprising a temperature detector that detects a temperature of the secondary battery,
    wherein the state-of-charge determinator determines the state of charge based on the temperature of the secondary battery detected by the temperature detector and the rate of change in the internal resistance calculated by the internal resistance changing rate calculator.

13. A program that causes a computer connected to a current detector that detects an electric current through a secondary battery and to a voltage detector that detects a voltage between terminals of the secondary battery, to function as a state-of-charge detector device that detects a state of charge of the secondary battery, the program comprising:
    calculating an internal resistance of the secondary battery based on the current detected by the current detector and the voltage detected by the voltage detector;

calculating a rate of change in the internal resistance calculated, with respect to an amount of charge stored in the secondary battery; and determining a state of charge of the secondary battery based on a peak in the internal resistance calculated.

14. A state-of-charge detecting method for detecting a state of charge of a secondary battery, comprising:

detecting an electric current through the secondary battery;

detecting a voltage between terminals of the secondary battery;

calculating an internal resistance of the secondary battery based on the current detected and the voltage detected;

calculating a rate of change in the internal resistance calculated, with respect to an amount of charge stored in the secondary battery; and determining a state of charge of the secondary battery based on a peak in the internal resistance calculated.

15. A charge-discharge control device that controls charging and discharging of a secondary battery, comprising:

a state-of-charge detector device as described in claim 1 which detects a state of charge of the secondary battery; and a charge-discharge controller that controls the charging and discharging of the secondary battery based on the state of charge detected.

16. A charge-discharge control device that controls charging and discharging of a secondary battery, comprising:

a state-of-charge detector device as described in claim 12 which detects a state of charge of the secondary battery; and a charge-discharge controller that controls the charging and discharging of the secondary battery based on the state of charge detected.

* * * * *